US012527201B2

(12) United States Patent
Yu

(10) Patent No.: US 12,527,201 B2
(45) Date of Patent: Jan. 13, 2026

(54) DISPLAY APPARATUS

(71) Applicant: LG Display Co., Ltd., Seoul (KR)

(72) Inventor: Hokyung Yu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 364 days.

(21) Appl. No.: 18/115,406

(22) Filed: Feb. 28, 2023

(65) Prior Publication Data

US 2023/0217784 A1 Jul. 6, 2023

(30) Foreign Application Priority Data

Dec. 29, 2021 (KR) ........................ 10-2021-0191466
Mar. 31, 2022 (KR) ........................ 10-2022-0040452

(51) Int. Cl.
*H10K 59/65* (2023.01)
*H10K 59/40* (2023.01)
*H10K 59/80* (2023.01)

(52) U.S. Cl.
CPC ............. *H10K 59/65* (2023.02); *H10K 59/40* (2023.02); *H10K 59/873* (2023.02); *H10K 59/8791* (2023.02)

(58) Field of Classification Search
CPC .... H10K 59/65; H10K 59/40; H10K 59/8791; H10K 59/873
See application file for complete search history.

(56) References Cited

U.S. PATENT DOCUMENTS 10,624,212 B2 * 4/2020 Osawa .................. H05K 1/144
2018/0335869 A1 * 11/2018 Watanabe ........... G06F 3/04164
2019/0212788 A1 * 7/2019 Kwak .................... H04N 23/45
2022/0328576 A1 * 10/2022 Huang .................. G02F 1/1333
2024/0188386 A1 * 6/2024 Zhang ................ H10K 59/1201

FOREIGN PATENT DOCUMENTS

KR 10-2017-0112790 A 10/2017
KR 10-2019-0089578 A 7/2019
KR 10-2020-0014459 A 2/2020

OTHER PUBLICATIONS

Horie, WO 2020100487, May 22, 2020 (Year: 2020).*

* cited by examiner

*Primary Examiner* — Mary Ellen Bowman
(74) *Attorney, Agent, or Firm* — Birch, Stewart, Kolasch & Birch, LLP

(57) ABSTRACT

A display apparatus according to an embodiment of the present disclosure can include a display panel including a first area including a sensor area where a first hole is disposed and a second area disposed along an outer periphery of the first area, a front member disposed on an upper surface of the display panel, a support member disposed on a rear surface of the display panel, a conductive member disposed on a rear surface of the support member, and a first member covering a border of a rear surface of the front member exposed from the first hole and an inner surface of the first hole.

20 Claims, 11 Drawing Sheets

DISPLAY APPARATUS

CROSS-REFERENCE TO RELATED APPLICATIONS

This application claims priority to Korean Patent Application No. 10-2021-0191466 filed on Dec. 29, 2021 in the Republic of Korea and Korean Patent Application No. 10-2022-0040452 filed on Mar. 31, 2022 in the Republic of Korea, the entire contents of all these applications being hereby expressly incorporated by reference into the present application.

BACKGROUND OF THE DISCLOSURE

Field

The present disclosure relates to a display apparatus.

Discussion of the Related Art

In response to the development of the information society, demand for display apparatus for displaying images is increasing. Further, various types of display apparatus such as a liquid crystal display apparatus and an organic light emitting display apparatus have been used.

A display apparatus used as a monitor of a computer, a TV or a mobile phone includes an organic light emitting display (OLED) apparatus that emits light by itself and a liquid crystal display (LCD) apparatus that requires a separate light source.

The display apparatus is applied to increasingly diverse fields, such as monitors of computers, TVs and personal portable devices. The display apparatus with a larger display area, and a reduced volume and weight is being researched.

Further, the display apparatus can be equipped with an optical device such as a camera and a proximity sensor in order to provide a user with more various functions. However, the optical device such as a camera has to be exposed to the outside to recognize. Thus, there has been developing a display apparatus in which a part thereof is cert out in a notch shape or a hole is formed therein to dispose an optical component.

SUMMARY OF THE DISCLOSURE

An object to be achieved by the present disclosure is to provide a display apparatus which can reduce noise in an optical sensor component disposed in a sensor area caused by light emitted from a plurality of sub-pixels. Further, the display apparatus can suppress a light leakage from a through-hole where the optical sensor component is disposed, and minimize degradation in reliability caused by charges generated in a cover window.

Another object to be achieved by the present disclosure is to provide a display apparatus which can achieve process simplification and manufacturing cost reduction.

According to an aspect of the present disclosure, a display apparatus can include a display panel including a first area including a sensor area where a first hole is disposed and a second area disposed along an outer periphery of the first area. The display apparatus can also include a front member disposed on an upper surface of the display panel, and a support member disposed on a rear surface of the display panel. The display apparatus can further include a conductive member disposed on a rear surface of the support member. The display apparatus can also include a first member covering a border of a rear surface of the front member exposed from the first hole and an inner surface of the first hole.

According to another aspect of the present disclosure, a display apparatus can include a display panel including a first area where a hole is disposed and a second area disposed along an outer periphery of the first area. The display apparatus can also include a front member disposed on an upper surface of the display panel and including a first light blocking layer disposed along a periphery of the hole in the first area and a second light blocking layer disposed along the second area. The display apparatus can further include a support layer disposed on a rear surface of the display panel and sharing the hole. The display apparatus can also include a conductive layer disposed on a rear surface of the support layer and sharing the hole, and a first member covering an inner surface of the hole.

According to the present disclosure, it is possible to reduce noise caused by a light leakage in a sensor area where an optical sensor component is disposed, and suppress damage to a display apparatus by discharging charges of a cover window. Therefore, it is possible to improve the reliability of the display apparatus.

According to the present disclosure, it is possible to reduce manufacturing cost and time by simplifying a process of forming or attaching a light blocking member or a conductive member.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
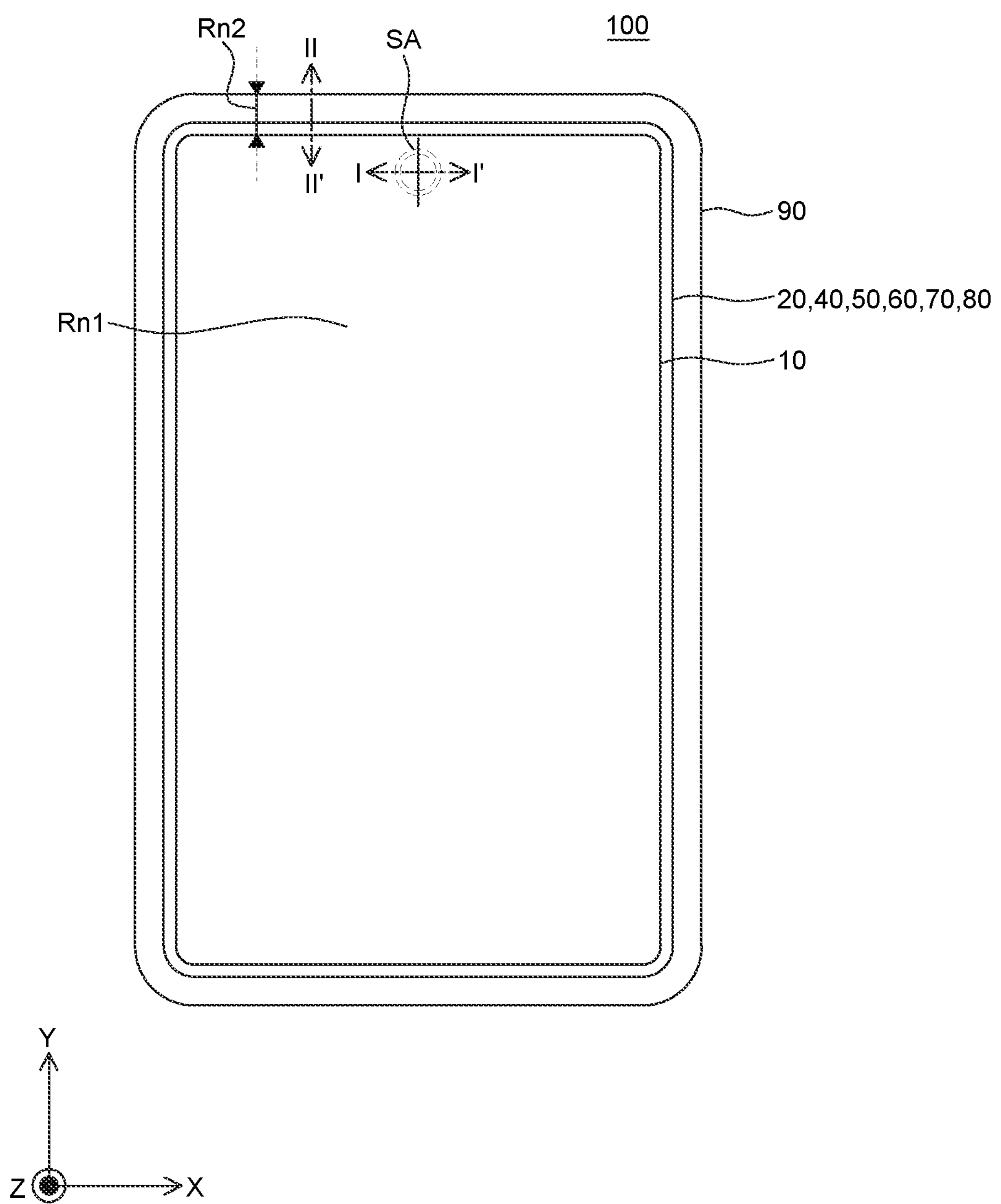
FIG. 1A is a plan view of a display apparatus according to an exemplary embodiment of the present disclosure.

The advantages and characteristics of the present disclosure and a method of achieving the advantages and characteristics will be clear by referring to exemplary embodiments described below in detail together with the accompanying drawings. However, the present disclosure is not limited to exemplary embodiments disclosed herein but will be implemented in various forms. The exemplary embodiments are provided by way of example only so that a person with ordinary skill in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," and "having" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", "under", and "next", one or more parts can be positioned between the two parts unless the terms are used with the term "immediately" or "directly".

When the time sequence between two or more incidents is described using the terms such as "after", "subsequent to", "next to", and "before", two or more incidents can be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below can be a second component in a technical concept of the present disclosure.

The features of various exemplary embodiments of the present disclosure can be partially or entirely adhered to or combined with each other and can be interlocked and operated in technically various ways, and the exemplary embodiments can be carried out independently of or in association with each other.

In the present disclosure, a "display apparatus" can include a narrow range of display apparatuses such as a liquid crystal module (LCM), an OLED module, and a quantum dot module that include a display panel and a driver for driving the display panel. The "display apparatus" can also include a complete product or a final product, including an LCM, an OLED module, a QD module, and the like, such as a laptop computer, a television, and a computer monitor, an equipment display apparatus including an automotive display apparatus or another type of vehicle, and a set electronic apparatus or a set device (or set apparatus) such as a mobile electronic apparatus such as a smart phone or an electronic pad.

The display apparatus in the present disclosure can also include a narrow range of display apparatus itself such as an LCM, an OLED module, and a QD module, an application product including an LCM, an OLED module, and a QD module, or a set device that is a final consumer device.

In some cases, an LCM, an OLED module, and a QD module configured by a display panel and a driver and the like can be expressed as a narrow range of "display apparatus", and an electronic device that is a final product including an LCM, an OLED module, and a QD module can also be expressed as a "set device". For example, a narrow range of display apparatus can be a concept which includes a display panel of LCD, OLED, or quantum dot and a source PCB that is a controller for driving the display panel. Further, the set device can be a concept which further includes a set PCB that is a set controller electrically connected to the source PCB to control the entire set device.

A display panel used in the present embodiments can use any type of display panel, such as a liquid crystal display panel, an organic light emitting diode (OLED) display panel, a quantum dot (QD) display panel, or an electroluminescent display panel. The display panel of the present exemplary embodiment is not limited to a specific display panel capable of realizing bezel bending using a flexible substrate for an OLED display panel and an underlying backplate support structure. Further, the shape or size of a display panel used for a display apparatus according to an exemplary embodiment of the present disclosure is not particularly limited.

For example, when the display panel is an OLED display panel, the display panel can include a plurality of gate lines, a plurality of data lines, and a plurality of pixels provided in intersections of the gate lines and the data lines. Further, the display panel can include an array including a thin film transistor for selectively applying a voltage to each pixel, an OLED layer on the array, and an encapsulation substrate or encapsulation layer disposed on the array to cover the OLED layer. The encapsulation layer can protect the thin film transistor and the OLED layer from external impacts, and can suppress the permeation of moisture or oxygen into the OLED layer. Furthermore, a layer provided on the array can include an inorganic light emitting layer, e.g., a nano-sized material layer or a quantum dot.

Hereinafter, various exemplary embodiments of a display apparatus that can reduce noise caused by a light leakage in a sensor area where an optical sensor component is disposed, and can suppress damage to the display apparatus by discharging charges of a cover window will be described in detail. All the components of each display apparatus according to all embodiments of the present disclosure are operatively coupled and configured.

Figure 1B:
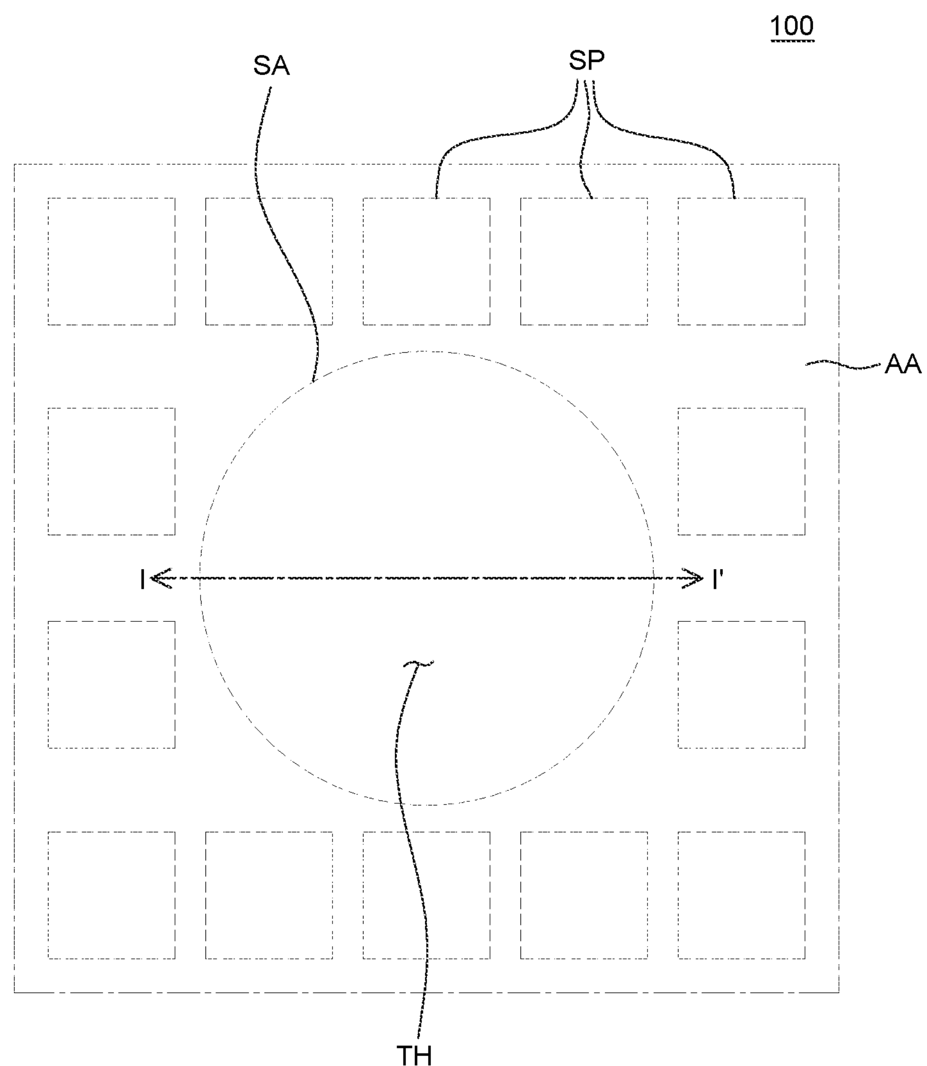
FIG. 1B is an enlarged plan view of the display apparatus shown in FIG. 1A.

FIG. 1A is a plan view of a display apparatus according to an exemplary embodiment of the present disclosure, and FIG. 1B is an enlarged plan view of the display apparatus shown in FIG. 1A.

Referring to FIGS. 1A and 1B, a display panel 40 of a display apparatus 100 is a panel in which images are implemented. Display elements for implementing images, and circuits, wiring lines, components, and the like for driving the display elements can be disposed in the display panel 40. The display panel 40 can include an active area AA, a non-active area and a sensor area SA.

The active area AA can be an area where a plurality of sub-pixels SP is disposed and images are displayed. Each of the plurality of sub-pixels SP is a separate unit for emitting light. A light emitting diode and a driving circuit can be formed in each of the plurality of sub-pixels SP. For example, a display element for displaying images and a circuit unit for driving the display element can be disposed in the plurality of sub-pixels SP. For example, if the display apparatus 100 is an organic light emitting display device, the display element can include an organic light emitting diode. If the display apparatus 100 is a liquid crystal display device, the display element can include a liquid crystal element. The plurality of sub-pixels SP can include a red sub-pixel SP, a green sub-pixel SP, a blue sub-pixel SP and/or a white sub-pixel SP, but is not limited thereto.

The non-active area is an area where images are not displayed, and various wiring lines and driver ICs (integrated circuits) for driving the plurality of sub-pixels SP disposed in the active area AA can be disposed. For example, various ICs, such as a gate driver IC and a data driver IC, and various driving circuits can be disposed in the non-active area, but the present disclosure is not limited thereto. The non-active area where images are not displayed can be a bezel area, but the exemplary embodiments of the present disclosure are not limited thereto.

The non-active area can be an area surrounding the active area AA. For example, the non-active area can be an area extending from the active area AA, or can be an area where the plurality of sub-pixels SP is not disposed, but is not limited thereto.

The sensor area SA can be disposed inside the active area AA. The sensor area (or camera area) SA can be disposed between the plurality of sub-pixels SP in the active area AA. The sensor area SA can be an area where an optical sensor component such as a camera or a proximity sensor is disposed. The sensor area SA can include a through-hole (or hole) TH penetrating some components of the display apparatus 100 to dispose the optical sensor component. It is possible to secure a space where the optical sensor component is disposed by forming the through-hole TH penetrating the display panel 40.

A part of light emitted from the plurality of sub-pixels SP can proceed toward the sensor area SA, e.g., the through-hole TH, disposed between the plurality of sub-pixels SP. When the light emitted from the plurality of sub-pixels SP toward the through-hole TH is propagated to the optical sensor component such as a camera or a proximity sensor, noise can be generated. Thus, the reliability of the optical sensor component can be degraded. A light blocking film can be disposed on the through-hole TH to suppress the propagation of light emitted from the plurality of sub-pixels SP into the through-hole TH. The light blocking film can be a shield layer or a light blocking member, but is not limited to the terms.

Figure 2:
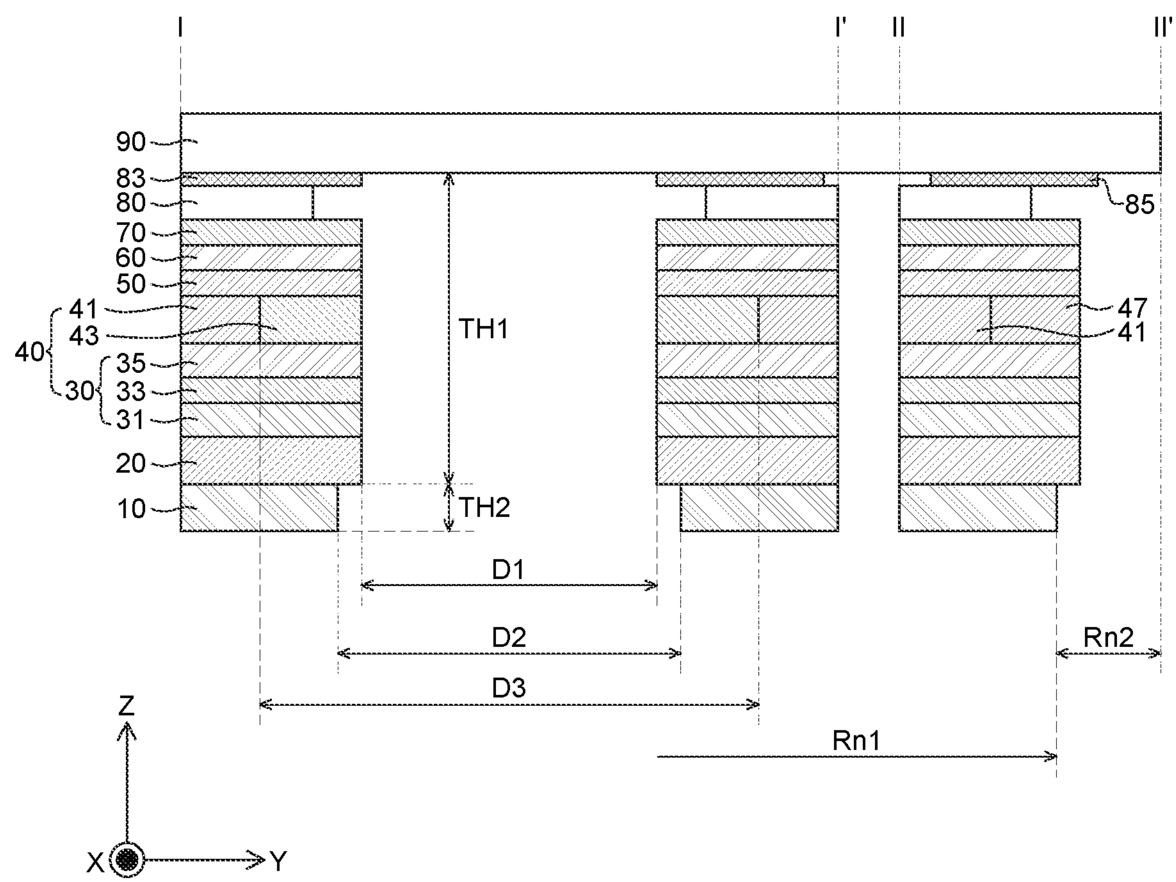
FIG. 2 is a cross-sectional view taken along a line I-I' and a line II-IF of FIGS. 1A and 1B.

FIG. 2 is a cross-sectional view taken along the line I-I' and the line II-II' of FIGS. 1A and 1B.

Referring to FIG. 2, the display apparatus 100 according to an exemplary embodiment of the present disclosure can include a front member 90, an adhesive layer 80, an optical layer 70 and a touch layer 60. The display apparatus 100 according to an exemplary embodiment of the present disclosure can also include an encapsulation layer 50, the display panel 40, a support member 20 and a conductive member 10.

The front member 90 can be disposed on an upper surface of the display panel 40. The front member 90 can protect the optical layer 70 and the display panel 40 disposed thereunder from external impacts, moisture and heat. The front member 90 can be made of a material having impact resistance and light transmittance. For example, the front member 90 can be a substrate made of glass, or a film made of a plastic material such as polymethylmethacrylate (PMMA), polyimide (PI) and polyethylene terephthalate (PET), but is not limited thereto. The front member 90 can be a window cover, a cover window or a cover glass, but is not limited to the terms.

The optical layer 70 can be disposed between the front member 90 and the display panel 40. The optical layer 70 can selectively transmit light to reduce the reflection of external light incident onto the display panel 40. For example, the display panel 40 includes various metal materials applied to thin film transistors, wiring lines and light emitting diodes. Therefore, external light incident onto the display panel 40 can be reflected from the metal materials so that the visibility of the display apparatus 100 can be degraded due to the reflection of the external light. Accordingly, the optical layer 70 disposed on one surface of the display panel 40 can suppress the reflection of external light, and increase the outdoor visibility of the display apparatus 100.

The adhesive layer 80 can be formed between the optical layer 70 and the front member 90 to attach the front member 90 onto the optical layer 70. The adhesive layer 80 can be made of an adhesive material. For example, the adhesive layer 80 can be made of an optical clear adhesive (OCA), or a pressure sensitive adhesive (PSA), but is not limited thereto.

The display panel 40 is a panel in which images are implemented. The display panel 40 can be configured by an emission unit 41 in which a plurality of display elements for implementing images on a substrate 30, and circuits, wiring lines, components, and the like for driving the display elements are disposed. For example, if the display apparatus 100 is an organic light emitting display device, the display element in the emission unit 41 can include organic light emitting diode.

The emission unit 41 can be formed on the substrate 30. The substrate 30 can be made of plastic such as polymer or polyimide (PI), or glass. The substrate 30 can be configured by a single layer or a plurality of layers. For example, the substrate 30 can be configured by a first PI substrate (or first layer) 31, or can be configured by a plurality of layers by laminating one or more second PI substrates (or second layers) 35 on the first PI substrate 31. If the substrate 30 is configured by a plurality of PI substrates, an inorganic insulating layer (Inter-PI Dielectric) (or insulating film or interlayer insulating film) 33 can be disposed between each PI substrates.

The emission unit 41 can be disposed on the substrate 30, and can include a driving element layer in which driving elements configured by a plurality of transistors are disposed and a light emitting diode layer disposed on the driving element layer. The driving element can use a transistor as a driving element to drive the light emitting diode in the active area AA. The transistor includes an active layer, a gate electrode, a source electrode and a drain electrode. The transistor serving as a driving element can have a top gate structure or a bottom gate structure depending on the position of the gate electrode, but is not limited thereto.

A transistor layer can drive each sub-pixel SP including the light emitting diode layer in response to a driving signal or a data signal received from the outside. The light emitting diode layer can operate to emit light according to a driving current or voltage formed by the driving element. The light emitting diode layer can be formed of a light emitting diode. The light emitting diode can include a light emitting diode including an anode electrode electrically connected to the driving element layer, a light emitting material formed on the anode electrode and a cathode electrode electrically connected to the light emitting material.

A display element (particularly, light emitting diode) in each sub-pixel SP inside the emission unit 41 is vulnerable to external moisture or oxygen. Thus, the encapsulation layer 50 for suppressing the permeation of external moisture or oxygen into the display element (particularly, light emitting diode) can be disposed on the display panel 40. The encapsulation layer 50 can be disposed to cover the light emitting diode.

The encapsulation layer 50 is formed on the display panel 40 to surround the active area AA and thus can suppress the permeation of oxygen or moisture into the light emitting diode layer of the emission unit 41. The encapsulation layer 50 according to an exemplary embodiment of the present disclosure can have a multilayered structure in which an organic material layer and an inorganic material layer are alternately laminated, but is not limited thereto. The inorganic material layer can suppress the permeation of oxygen or moisture into the light emitting diode layer of the emission unit 41. The organic material layer can have a greater thickness than the inorganic material layer so as to cover particles which can be generated during a manufacturing process, but is not limited thereto. For example, an encapsulation unit can include a first inorganic film, an organic film on the first inorganic film and a second inorganic film on the organic film. The organic film can be a foreign matter cover layer, but is not limited to the terms.

The touch layer 60 can be disposed on the encapsulation layer 50, or can be disposed on a rear surface of the display panel 40 or inside the display panel 40. If the display apparatus 100 is equipped with a panel type touch sensor, the thickness and/or width of the display apparatus 100 can increase. Thus, research has been conducted to dispose the touch sensor inside the display apparatus 100, and a structure in which a touch sensing unit is disposed on the encapsulation layer 50 has been suggested as one of the methods. Such a built-in touch sensor is also referred to as a touch-sensor on encapsulation (ToE).

A structure of the touch layer 60 will be described in detail below. A touch buffer film can be disposed on the encapsulation layer 50. A touch sensor can be disposed on the touch buffer film, and can include touch sensor metals and a bridge metal located on a different layer from each other. A touch interlayer insulating film can be disposed between the touch sensor metals and the bridge metal. For example, the touch sensor metals can include a first touch sensor metal, a second touch sensor metal and a third touch sensor metal which are disposed adjacent to each other.

The third touch sensor metal can be disposed between the first touch sensor metal and the second touch sensor metal. When the first touch sensor metal and the second touch sensor metal need to be electrically connected to each other, they can be electrically connected to each other by the bridge metal located on the different layer. The bridge metal can be insulated from the third touch sensor metal by the touch interlayer insulating film. A protective layer can be disposed to cover the touch sensor. The protective layer can be an organic insulating film, but is not limited to the material.

The optical layer 70 can be disposed on the touch layer 60. The optical layer 70 can convert polarization of external light reflected from the metals of the touch layer 60 and the display panel 40 to improve visibility and a contrast ratio. The optical layer 70 can be embodied as a polarizing plate or circular polarizing plate in which a linear polarizing plate and a phase delay film are bonded to each other, but is not limited thereto.

The support member (or support layer) 20 can be disposed under the display panel 40. If the substrate 30 included in the display panel 40 is made of a plastic material such as polyimide, a support substrate made of glass can be disposed under the substrate 30. Then, a manufacturing process of the display apparatus 100 can be performed. After components such as the optical layer 70 are formed on the display panel 40, the support substrate can be released. Even after the support substrate is released, a component for supporting the substrate is needed. Therefore, the support member 20 for supporting the substrate can be disposed under the display panel 40.

The support member 20 supports the display panel 40, and can also protect the display panel 40 from external moisture, heat and impacts. The support member 20 can be a film made of polyimide (PI), polyethylene terephthalate (PET) or polyethylene naphthalate (PEN), but is not limited thereto. The support member 20 can be a rear plate, a first plate or a hard plate, but is not limited to the terms.

The conductive member (or conductive layer) 10 can be disposed under the support member 20. The conductive member 10 can protect and support a structure on the conductive member 10. The conductive member 10 can be made of a stiff material and thus can minimize indentations caused by external impacts. The conductive member 10 can serve as a heat dissipation member to dissipate heat generated while the display apparatus 100 is driven. The conductive member 10 is made of a material having excellent electrical conductivity and thus can discharge static electricity generated in the front member 90 or the like to the outside.

The conductive member 10 can be made of a material having excellent thermal conductivity and electrical conductivity. For example, the conductive member 10 can be made of a material including copper (Cu) or graphite, but is not limited thereto. The conductive member 10 can be a metal plate, a second plate or a stiff member, but is not limited to the terms.

The through-hole (or first hole or hole) TH can be formed in the components of the display apparatus 100 except the front member 90. The through-hole TH can be formed penetrating the adhesive layer 80, the optical layer 70, the touch layer 60, the encapsulation layer 50, the display panel 40, the support member 20 and the conductive member 10. The through-hole TH can be a space or an empty space where an optical component such as a camera is disposed in the active area AA.

The optical component is disposed in the through-hole TH and can recognize an external environment outside the front member 90. The optical component can operate by recognizing external light propagated to the optical component through the front member 90. Since the through-hole TH is not formed in the front member 90, it is possible to suppress the permeation of foreign matters into the through-hole TH.

The through-hole TH of the conductive member 10 can have various sizes depending on the sequence of a process of attaching the conductive member 10 and a process of forming the through-hole TH. Hereinafter, the through-hole TH consecutively formed in, for example, disposed along, the adhesive layer 80, the optical layer 70, the touch layer 60, the encapsulation layer 50, the display panel 40 and the support member 20 will be referred to as a first hole (or first through-hole) TH1. Further, the through-hole TH formed in the conductive member 10 will be referred to as a second hole (or second through-hole) TH2.

The first hole TH1 having a first diameter D1 is formed at once in the adhesive layer 80, the optical layer 70, the touch layer 60, the encapsulation layer 50, the display panel 40 and the support member 20. Then, the conductive member 10 in which the second hole TH2 is formed having a second diameter D2 can be attached to a rear surface of the support member 20. For example, the first diameter D1 of the first hole TH1 can be smaller than the second diameter D2 of the second hole TH2. If the second hole TH2 is smaller than the first hole TH1, it can be difficult to align the second hole TH2 with the first hole TH1 when the conductive member 10 is attached. Further, it can be difficult to form a first member 120 to be described later inside the first hole TH1. Therefore, if the through-hole TH is formed before the conductive member 10 is attached, the display apparatus 100 can be manufactured by attaching the adhesive layer 80, the optical layer 70, the touch layer 60, the encapsulation layer 50, the display panel 40 and the support member 20 in which the first hole TH1 is formed, to the conductive member 10 in which the second hole TH2 is formed to have a greater diameter than the first hole TH1.

For another example, after attaching the adhesive layer 80, the optical layer 70, the touch layer 60, the encapsulation layer 50, the display panel 40 and the support member 20, the through-hole TH can be formed. For example, the first hole TH1 formed in the adhesive layer 80, the optical layer 70, the touch layer 60, the encapsulation layer 50, the display panel 40 and the support member 20 can have the same diameter as the second hole TH2 formed in the conductive member 10. The through-hole TH formed in the adhesive layer 80, the optical layer 70, the touch layer 60, the encapsulation layer 50, the display panel 40, the support member 20 and the conductive member 10 can have various diameters, but is not limited thereto.

The light emitting diode in each sub-pixel SP inside the emission unit 41 of the display panel 40 is vulnerable to external moisture or oxygen. Thus, the encapsulation layer 50 for suppressing the permeation of external moisture or oxygen into the light emitting diode can be disposed on the display panel 40.

The driving element layer of the emission unit 41 can be formed in both the active area AA and the non-active area, but the light emitting diode layer can be formed only in the active area AA. The non-active area where images are not displayed can be an outer bezel area 47 or a second bezel area. In the outer bezel area 47, a part of the driving element layer and a part of the encapsulation layer 50 covering a side surface of the light emitting diode layer in the active area AA can be disposed.

The through-hole TH is formed in the display panel 40. A driving element layer and a light emitting diode layer identical to those of the emission unit 41 in which the through-hole TH is not formed can be disposed in and around the through-hole TH. In this case, external moisture or oxygen can permeate into the light emitting diode through a side surface where the through-hole is formed. To suppress this problem, an inner bezel area 43 or a first bezel area can be disposed around the through hole of the emission unit 41.

A part of the driving element layer and a part of the encapsulation layer 50 covering a side surface of the light emitting diode layer in the active area AA can be disposed in the inner bezel area 43. For example, a diameter D3 of a hole formed in the light emitting diode layer can be greater than the diameter D1 of the first hole TH1. The inner bezel area 43 can have an annular shape extending from an inner surface of the hole formed in the light emitting diode layer to an inner surface of the first hole TH1, but is not limited to the shape.

Light emitted from the emission unit 41 is propagated to the outside of the display apparatus 100 through the front member 90. The front member 90 can be divided into a light transmitting area and a light blocking area depending on whether to propagate the emitted light to the outside. For example, light emitted from the emission unit 41 can be propagated to the outside through the light transmitting area of the front member 90. For example, the propagation of light emitted from the emission unit 41 to the outside can be blocked by the light blocking area of the front member 90.

The light blocking area of the front member 90 can be configured through a first light blocking member (or first light blocking layer) 85 enclosing the entire outer periphery of the front member 90. Further, the light blocking area of the front member 90 can be configured through a second light blocking member (or second light blocking layer) 83 formed in a contact area between the front member 90 and the first hole TH1. The first light blocking member 85 is formed into a solid line enclosing the entire outer periphery of the front member 90, and can serve to block the propagation of light from the active area AA to the outer periphery of the front member 90. The second light blocking member 83 is formed into a solid line enclosing an outer periphery of the first hole TH1 in the contact area between the front member 90 and the first hole TH1. Further, the second light blocking member 83 can serve to block the propagation of light from the active area AA to the through-hole TH or the sensor area SA of the front member 90. The first light blocking member 85 and the second light blocking member 83 can be formed on a rear surface of the front member 90 and can be attached to the components including the display panel 40 by means of the adhesive layer 80.

The conductive member 10 can have a smaller size than the support member 20, the display panel 40 and/or the front member 90 disposed thereon. Particularly, the conductive member 10 can have a smaller size than the front member 90. In a plan view, an outer peripheral portion by which the front member 90 is different in area size from the conductive member 10 can be defined as a second area Rn2, and the other portion can be defined as a first area Rn1. The conductive member 10 can discharge static electricity generated in the front member 90 or the like to the outside. To this end, a connection member for electrically connecting the conductive member 10 to the front member 90 is needed. To minimize a space required for the connection between the conductive member 10 and the connection member, the conductive member 10 can be configured to have a smaller area size than the front member 90 or the like. The second area Rn2 can be used to electrically connect the conductive member 10 and the front member 90 or the like. For example, a space equivalent to the height of the conductive member 10 can be used as a connection space for the connection with the connection member.

Figure 3:
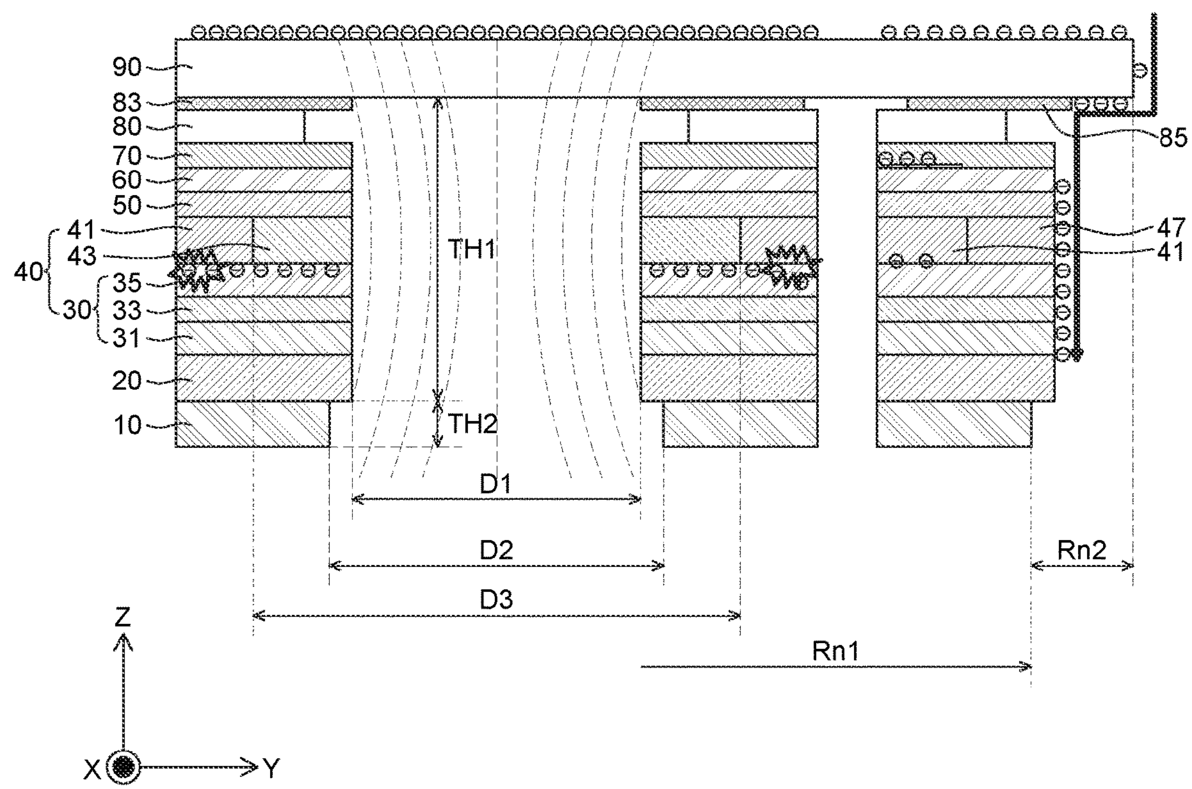
FIG. 3 is a diagram for explaining the accumulation and flow of charges of the display apparatus.

FIG. 3 is a diagram for explaining the accumulation and flow of charges of the display apparatus.

Referring to FIG. 3, charges can be generated due to physical friction on a surface of the display apparatus 100, e.g., on the front member 90. If the generated charges do not be discharged to the outside through a ground path, the charges can be concentrated on side surfaces of edges of the display panel 40 located in the bezel areas 43 and 47 of the display panel 40. If charges are concentrated and accumulated in a specific area, an electric field can be generated in proportion to the amount of charges accumulated.

If the charges generated on the surface of the display apparatus 100 do not be effectively discharged to the outside, a strong electric field can be generated on the side surfaces of the edges of the display panel 40. When the strong electric field is generated on the side surfaces of the edges of the display panel 40, the side surfaces of the edges become brighter than the active area AA of the display panel 40, which affects the reliability of the display apparatus 100.

Figure 4:
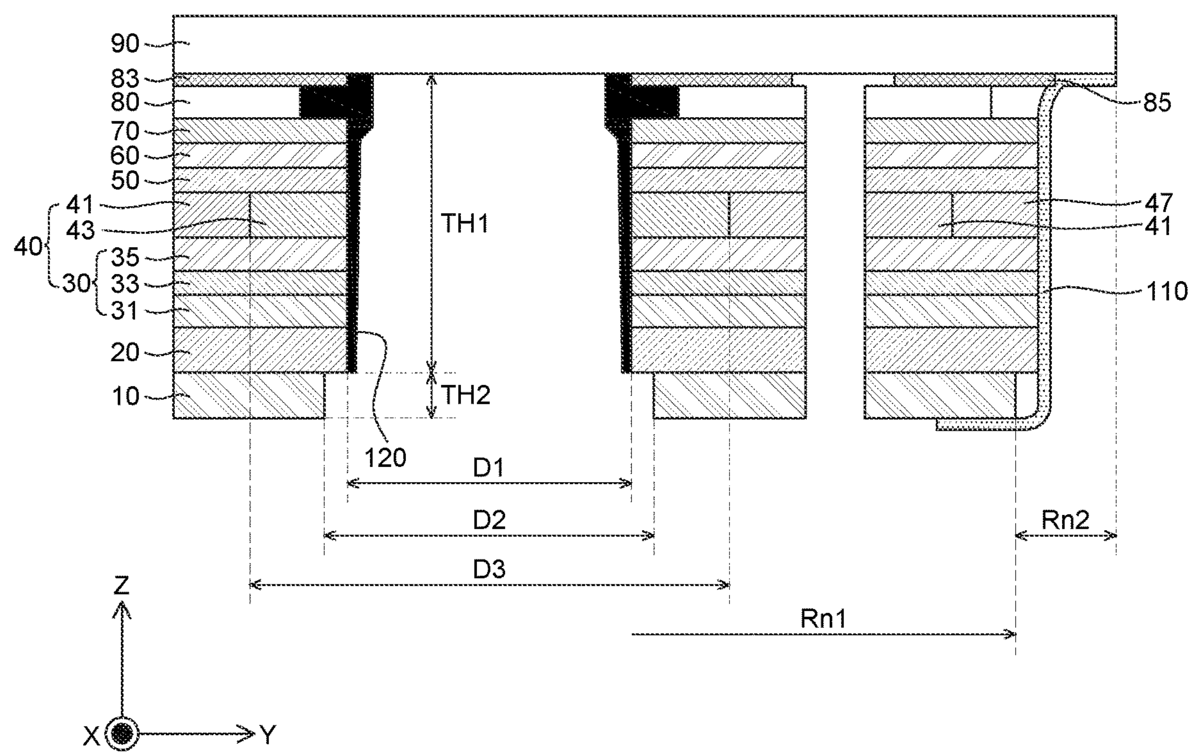
FIG. 4 is a cross-sectional view taken along the line I-I' and the line II-II' of FIGS. 1A and 1B according to an exemplary embodiment of the present disclosure.
Figure 5:
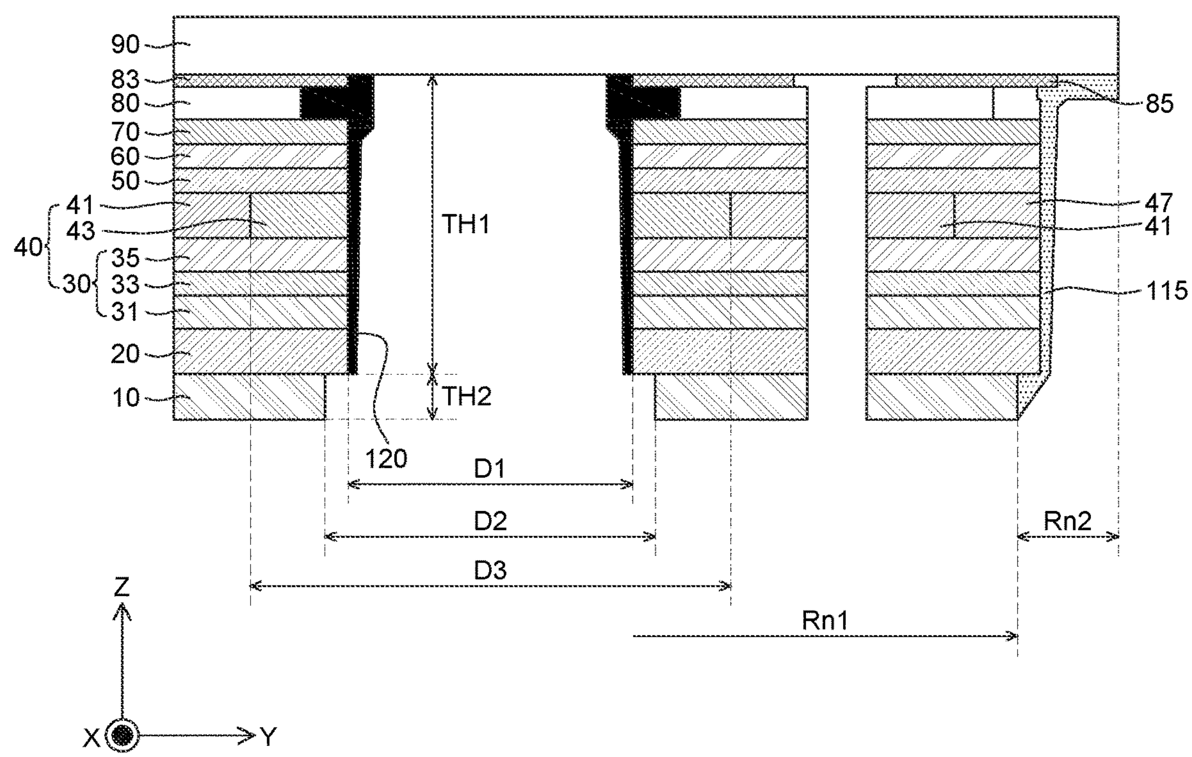
FIG. 5 is a cross-sectional view taken along the line I-I' and the line II-II' of FIGS. 1A and 1B according to an exemplary embodiment of the present disclosure.
Figure 6:
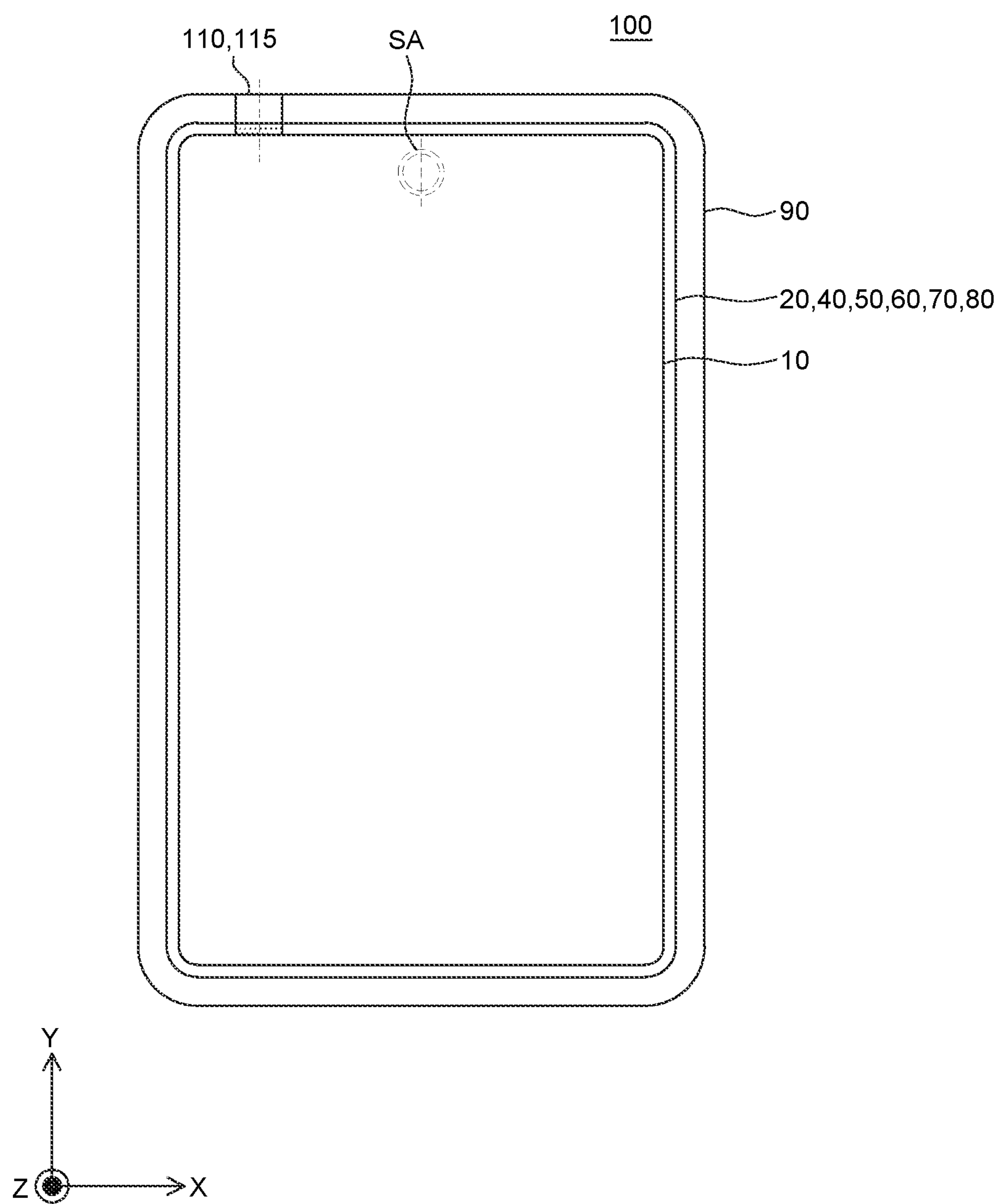
FIG. 6 is a plan view of the display apparatus according to an exemplary embodiment of the present disclosure.

FIGS. 4 and 5 are cross-sectional views as taken along the line I-I' and the line II-IF of FIGS. 1A and 1B according to an exemplary embodiment of the present disclosure. FIG. 6 is a plan view of the display apparatus according to an exemplary embodiment of the present disclosure.

Referring to FIGS. 4 to 6, the display apparatus 100 according to an exemplary embodiment of the present disclosure can include the front member 90, the adhesive layer 80 and the optical layer 70. The display apparatus 100 according to an exemplary embodiment of the present disclosure can also include the touch layer 60, the encapsulation layer 50, the display panel 40, the support member 20 and the conductive member 10. The components shown in FIGS. 4 to 5 are the same as those shown in FIG. 2. Thus, explanation thereof can be omitted or simplified.

Referring to FIG. 4, in the display apparatus 100 according to an exemplary embodiment of the present disclosure, the sensor area SA is disposed inside the active area AA. The sensor area SA includes the through-hole (or hole) TH penetrating some components of the display apparatus 100 to dispose the optical sensing component such as a camera. It is possible to secure a space where the optical sensing component is disposed by forming the through-hole TH penetrating the display panel 40. Moisture permeating into a space inside the through-hole TH can further permeate into the adhesive layer 80, the optical layer 70, the touch layer 60, the encapsulation layer 50, the display panel 40 and/or the support member 20 disposed along the through-hole TH. Then, the moisture can affect the performance of each component.

The first member 120 is disposed inside the through-hole TH. The first member 120 can be made of a moisture proof material. Further, the first member 120 can cover each side surface of the adhesive layer 80, the optical layer 70, the touch layer 60, the encapsulation layer 50, the display panel 40 and/or the support member 20 disposed inside the through-hole TH. The first member 120 can be disposed to cover an inner peripheral surface of the through-hole TH and a part of a rear surface of the front member 90 corresponding to the circumference of the through-hole TH. Thus, the first member 120 can suppress further permeation of moisture, which has been permeated into the through-hole TH, into the adhesive layer 80, the optical layer 70, the touch layer 60, the encapsulation layer 50, the display panel 40 and/or the support member 20 disposed along the through-hole TH.

The first member 120 can be made of a non-conductive material or a conductive material. The first member 120 can be a light blocking member, a light blocking film or a shield layer, but is not limited to the terms and material. The first member 120 can block the introduction of light from the display panel 40 into the through-hole TH, and can change or block the flow of charges generated from the front member 90. The first member 120 can cover a part of at least one of a side surface of the support member 20, a side surface of the display panel 40 including a side surface of the substrate 30 and a side surface of the inner bezel area 43, a side surface of the encapsulation layer 50, a side surface of the touch layer 60, a side surface of the optical layer 70 and a side surface of the adhesive layer 80 exposed through the first hole TH1.

The first member 120 can be made of an opaque and electrically conductive material. Thus, the first member 120 can change or block the flow of charges while suppressing a light leakage. The first member 120 can be made of a conductive ink or conductive paste. For example, the first member 120 can be made of a conductive ink in which conductive particles such as carbon black, or a conductive polymer such as poly(3,4-ethylenedioxythiophene) (PEDOT:PSS) is mixed, or conductive paste such as silver paste, but is not limited thereto. Further, the first member 120 can have a resistance of 0 to 106Ω (ohm) to discharge static electricity, but is not limited thereto.

A conductive tape 110 for electrically connecting the conductive member 10 and the front member 90 can be disposed in the second area Rn2. The conductive tape 110 can electrically connect the front member 90 exposed in the second area Rn2 to the conductive member 10. The conductive tape 110 can be entirely or partially disposed in the second area Rn2. For example, the number and width (area) of conductive tapes 110 disposed in the second area Rn2 can be variously defined depending on the design of the display apparatus 100. The conductive tape 110 can connect to an upper portion or a side surface of the conductive member 10, but is not limited to the position.

The charges accumulated in the front member 90 can move to the conductive member 10 through the conductive tape 110, and, thus, it is possible to suppress the accumulation of charges in the side surface of the edge of the display panel 40. Accordingly, it is possible to suppress the generation of an electric field on the side surface of the edge of the display panel 40 and thus possible to improve the reliability of the display apparatus 100.

Referring to FIGS. 5 and 6, a third member 115 for electrically connecting the conductive member 10 and the front member 90 can be disposed in the second area Rn2. The third member 115 can electrically connect the front member 90 exposed in the second area Rn2 to the conductive member 10. The third member 115 can be a conductive pattern, a sealer or a conductive ink, but is not limited to the terms.

The third member 115 can be made of a conductive ink or a conductive paste. For example, the third member 115 can be made of a conductive ink in which conductive particles such as carbon black or a conductive polymer such as poly(3,4-ethylenedioxythiophene) (PEDOT:PSS) is mixed, or conductive paste such as silver paste, but is not limited thereto. The third member 115 can be entirely or partially disposed in the second area Rn2. The third member 115 can connect to a side surface of the conductive member 10. Since an additional vertical space for the connection between the third member 115 and the conductive member 10 is not required, there is an advantage in that the display apparatus 100 can be slimmed.

The charges accumulated in the front member 90 can move to the conductive member 10 through the third member 115, and, thus, it is possible to suppress the accumulation of charges in the side surface of the edge of the display panel 40. Accordingly, it is possible to suppress the generation of an electric field on the side surface of the edge of the display panel 40, and thus possible to improve the reliability of the display apparatus 100.

Figure 7:
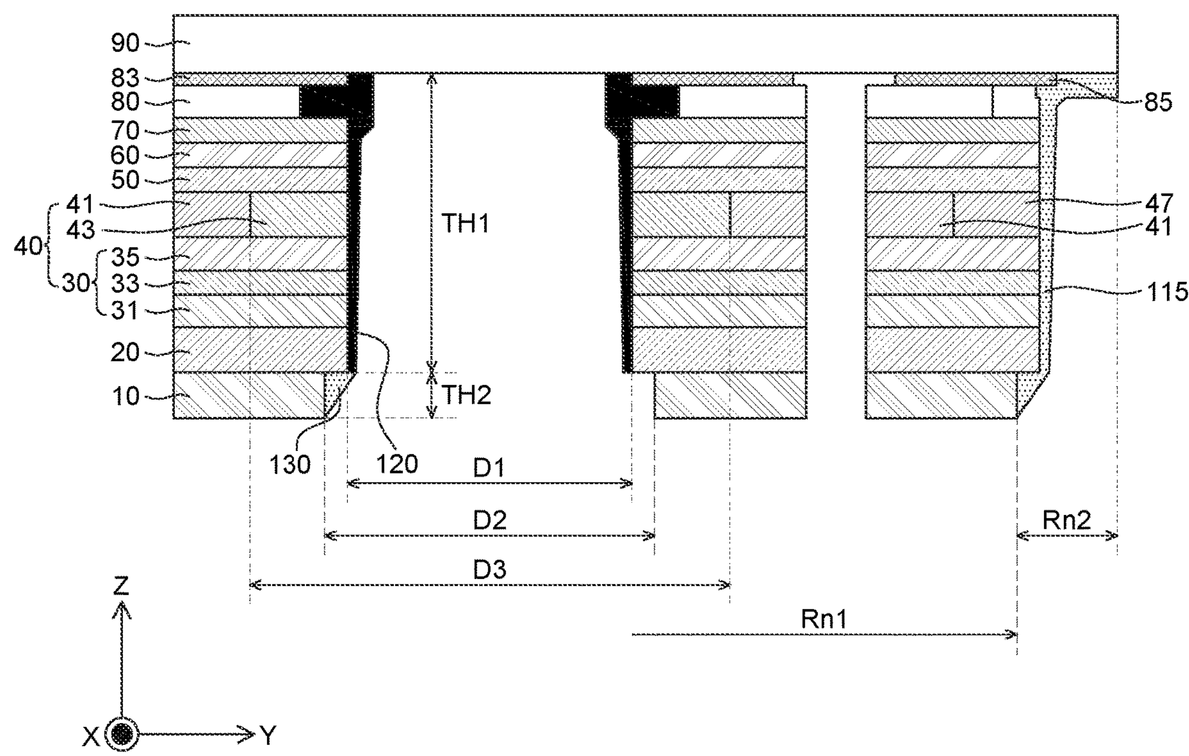
FIG. 7 is a cross-sectional view taken along the line I-I' and the line II-II' of FIGS. 1A and 1B according to an exemplary embodiment of the present disclosure.
Figure 8:
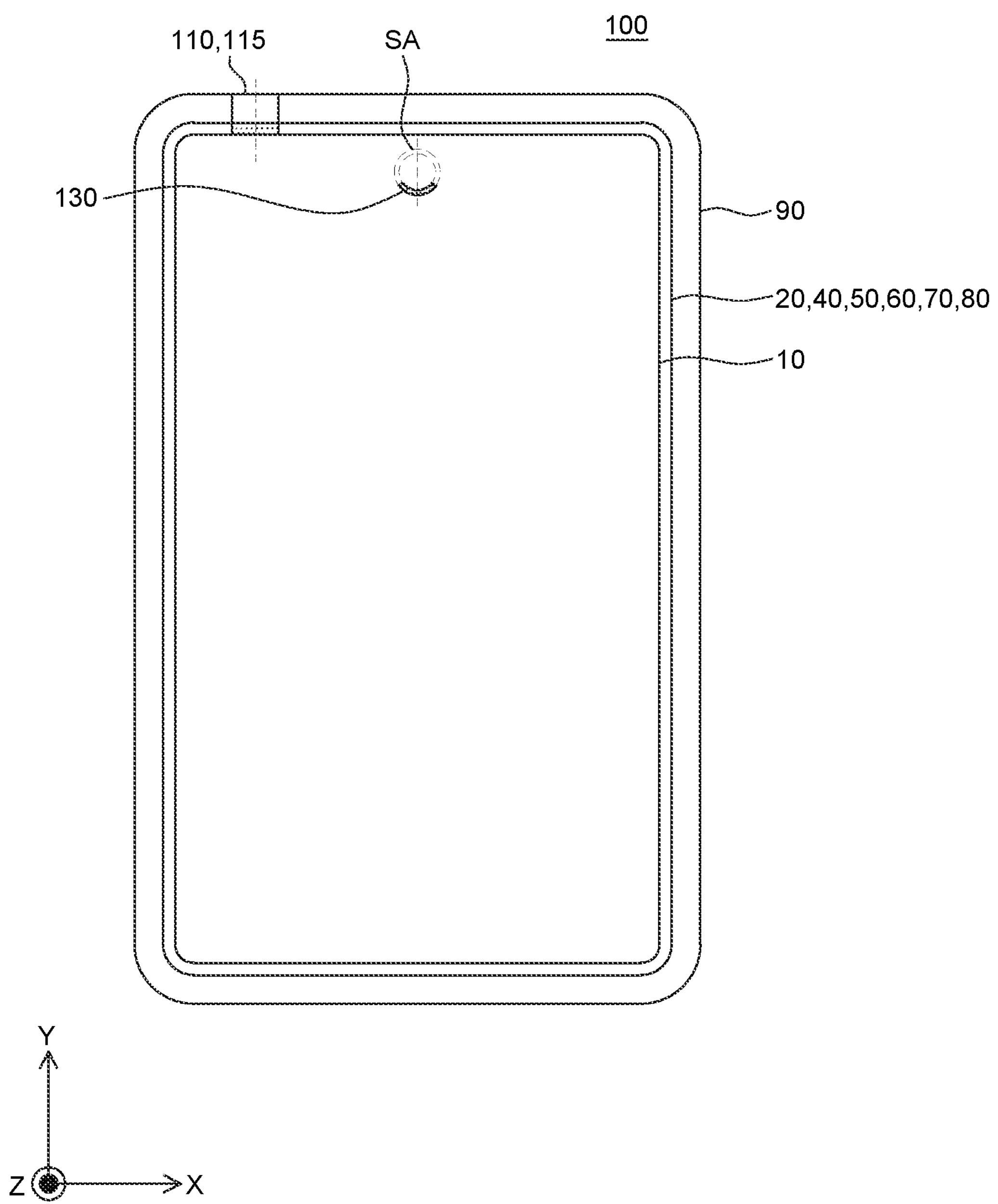
FIG. 8 is a plan view of the display apparatus according to an exemplary embodiment of the present disclosure.

FIG. 7 is a cross-sectional view taken along the line I-I' and the line II-II' of FIGS. 1A and 1B according to an exemplary embodiment of the present disclosure. FIG. 8 is a plan view of the display apparatus according to an exemplary embodiment of the present disclosure.

Referring to FIGS. 7 and 8, the display apparatus 100 according to an exemplary embodiment of the present disclosure can include the front member 90, the adhesive layer 80, the optical layer 70 and the touch layer 60. The display apparatus 100 according to an exemplary embodiment of the present disclosure can also include the encapsulation layer 50, the display panel 40, the support member 20 and the conductive member 10. The components shown in FIGS. 7 and 8 are substantially the same as those shown in FIGS. 5 and 6. Thus, explanation thereof can be omitted or simplified.

Referring to FIG. 7, in the display apparatus 100 according to an exemplary embodiment of the present disclosure, the sensor area SA is disposed inside the active area AA. The sensor area SA includes the through-hole (or hole) TH penetrating some components of the display apparatus 100 to dispose the optical sensing component such as a camera. It is possible to secure a space where the optical sensing component is disposed by forming the through-hole TH penetrating the display panel 40. Moisture permeating into a space inside the through-hole TH can further permeate into the adhesive layer 80, the optical layer 70, the touch layer 60, the encapsulation layer 50, the display panel 40 and/or the support member 20 disposed along the through-hole TH. Then, the moisture can affect the performance of each component.

The first member 120 can be disposed inside the through-hole TH. The first member 120 can be made of a moisture proof material. Further, the first member 120 can cover a side surface of at last one of the adhesive layer 80, the optical layer 70, the touch layer 60, the encapsulation layer 50, the display panel 40 and/or the support member 20 disposed inside the through-hole TH. The first member 120 can be disposed to cover an inner peripheral surface of the through-hole TH and a part of a rear surface of the front member 90 corresponding to the circumference (or vicinity) of the through-hole TH. Thus, the first member 120 can suppress further permeation of moisture, which has permeated into the through-hole TH, into the adhesive layer 80, the optical layer 70, the touch layer 60, the encapsulation layer 50, the display panel 40 and/or the support member 20 disposed along the through-hole TH.

The first member 120 can be made of a non-conductive material or a conductive material. The first member 120 can be a light blocking member, a light blocking film or a shield layer, but is not limited to the terms and material. The first member 120 can block the introduction of light from the display panel 40 into the through-hole TH, and can change or block the flow of charges generated from the front member 90. The first member 120 can cover a part of at least one of a side surface of the support member 20, a side surface of the display panel 40 including a side surface of the substrate 30 and a side surface of the inner bezel area 43, a side surface of the encapsulation layer 50, a side surface of the touch layer 60, a side surface of the optical layer 70 and a side surface of the adhesive layer 80 exposed through the first hole TH1.

The display apparatus 100 according to an exemplary embodiment of the present disclosure can include a second member 130 for connecting a lower side of the first member 120 to the conductive member 10. The second member 130 can be a conductive pattern having electrical conductivity and can be made of the same material as the first member 120, but is not limited thereto.

The second member 130 can electrically connect the first member 120 to the conductive member 10. For example, the second member 130 can connect a lower side of the first member 120 and a part of a side surface of the conductive member 10. The second member 130 can be disposed on a part of the support member 20 exposed through the second hole TH2, which is the through-hole TH formed in the conductive member 10. The second member 130 can have an annular sector shape or a partial ring shape, but is not limited thereto.

The second member 130 moves the charges accumulated in the front member 90 to the conductive member 10 through the first member 120 like the third member 115 to be described later. Thus, it is possible to suppress the accumulation of charges in the side surfaces of the edges of the display panel 40, particularly in the inner bezel area 43. Accordingly, it is possible to suppress malfunction caused by an electric field generated on the side surfaces of the edges of the display panel 40, and thus possible to improve the reliability of the display apparatus 100.

The third member 115 for electrically connecting the conductive member 10 and the front member 90 can be disposed in the second area Rn2. The third member 115 can electrically connect the front member 90 exposed in the second area Rn2 to the conductive member 10. The third member 115 can be a conductive pattern, a sealer or a conductive ink, but is not limited to the terms.

The charges accumulated in the front member 90 can move to the conductive member 10 through the third member 115, and, thus, it is possible to suppress the accumulation of charges in the side surfaces of the edges of the display panel 40. Accordingly, it is possible to suppress the generation of an electric field on the side surfaces of the edges of the display panel 40, and thus possible to improve the reliability of the display apparatus 100.

Figure 9:
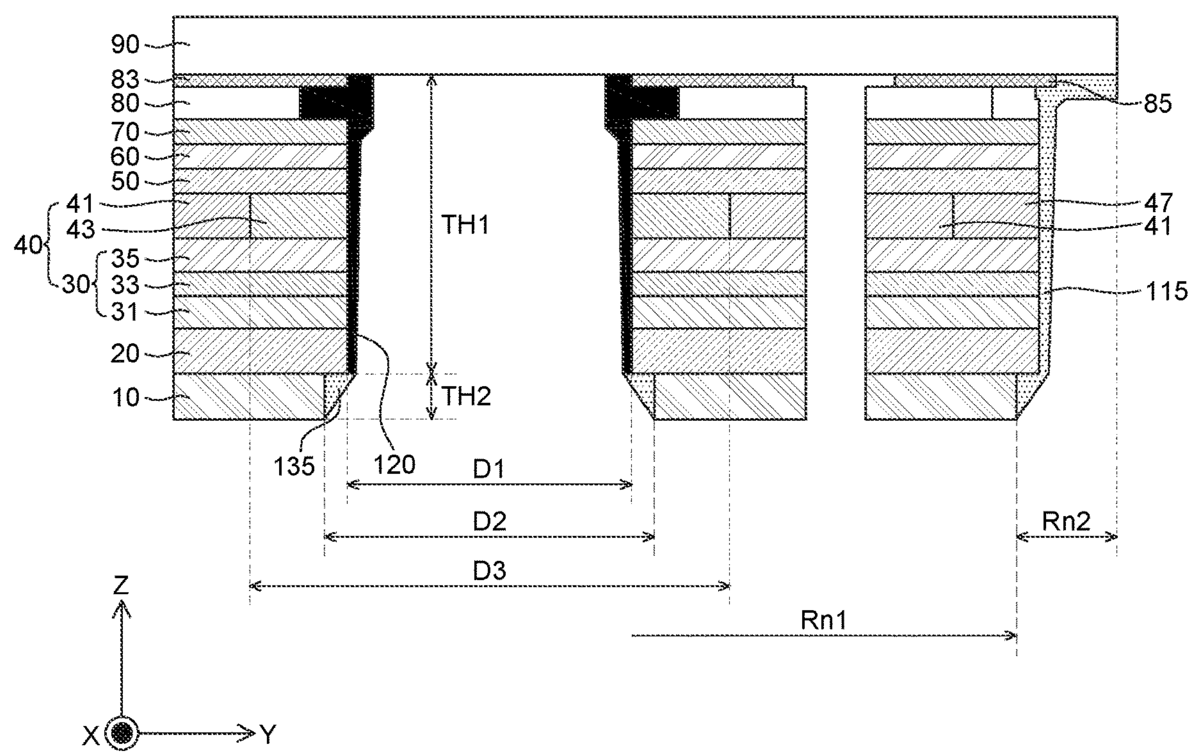
FIG. 9 is a cross-sectional view taken along the line I-I' and the line II-II' of FIGS. 1A and 1B according to an exemplary embodiment of the present disclosure.
Figure 10:
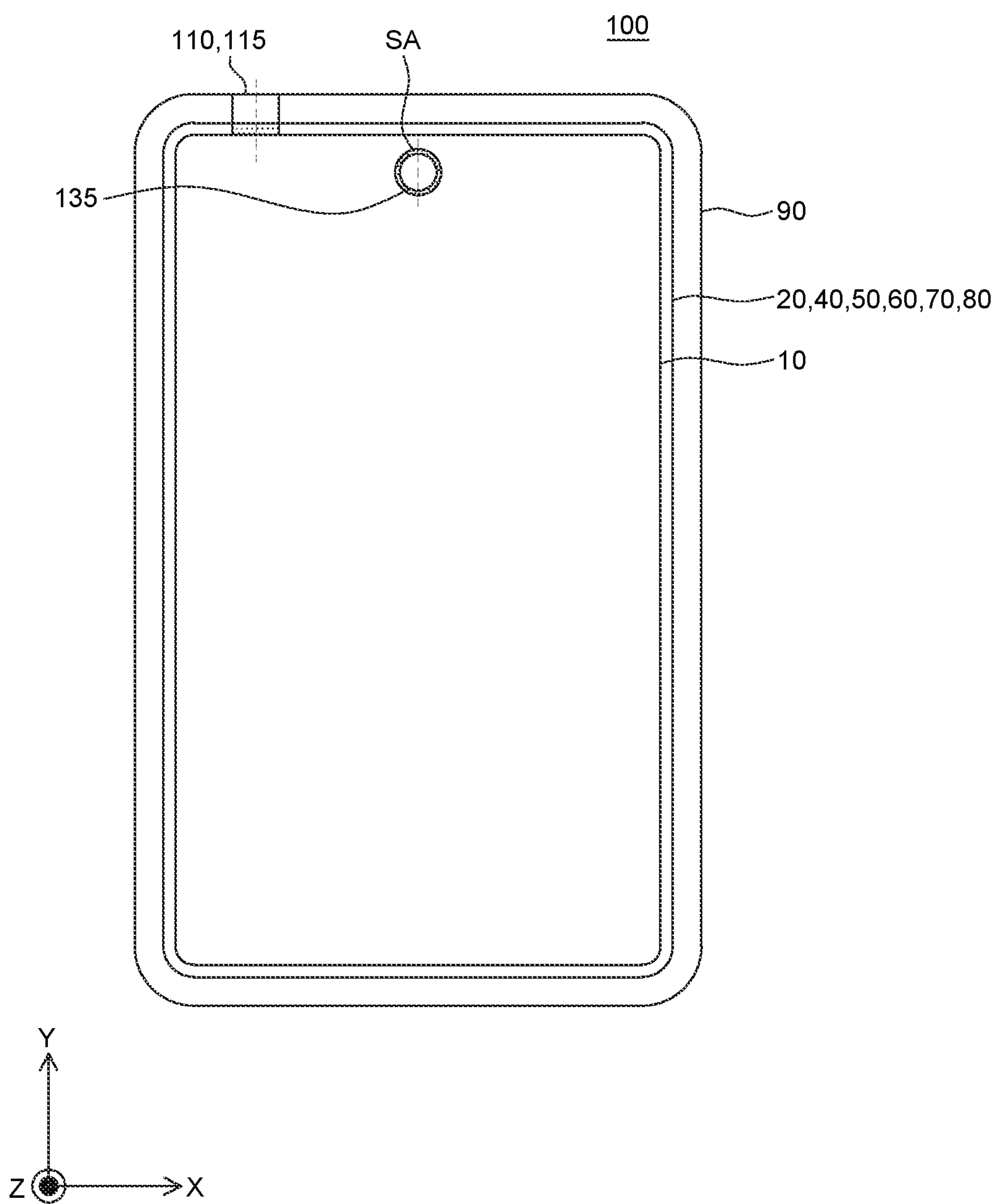
FIG. 10 is a plan view of the display apparatus according to an exemplary embodiment of the present disclosure.

FIG. 9 is a cross-sectional view taken along the line I-I' and the line II-II' of FIGS. 1A and 1B according to an exemplary embodiment of the present disclosure. FIG. 10 is a plan view of the display apparatus according to an exemplary embodiment of the present disclosure.

Referring to FIGS. 9 and 10, the display apparatus 100 according to an exemplary embodiment of the present disclosure can include the front member 90, the adhesive layer 80, the optical layer 70 and the touch layer 60. The display apparatus 100 according to an exemplary embodiment of the present disclosure can also include the encapsulation layer 50, the display panel 40, the support member 20 and the conductive member 10. The components shown in FIGS. 9 and 10 are substantially the same as those shown in FIGS. 7 and 8. Thus, explanation thereof can be omitted or simplified.

Referring to FIG. 9, in the display apparatus 100 according to an exemplary embodiment of the present disclosure, the sensor area SA can be disposed inside the active area AA. The sensor area SA can include the through-hole (or hole) TH penetrating some components of the display apparatus 100 to dispose the optical sensing component such as a camera. It is possible to secure a space where the optical sensing component is disposed by forming the through-hole TH penetrating the display panel 40. Moisture permeating into a space inside the through-hole TH can further permeate into the adhesive layer 80, the optical layer 70, the touch layer 60, the encapsulation layer 50, the display panel 40 and/or the support member 20 disposed along the through-hole TH. Then, the moisture can affect the performance of each component.

The first member 120 can be disposed inside the through-hole TH. The first member 120 can be made of a moisture proof material. Further, the first member 120 can cover a side surface of at last one of the adhesive layer 80, the optical layer 70, the touch layer 60, the encapsulation layer 50, the display panel 40 and/or the support member 20 disposed inside the through-hole TH. The first member 120 can be disposed to cover an inner peripheral surface of the through-hole TH and a part of a rear surface of the front member 90 corresponding to the circumference (or vicinity) of the through-hole TH. Thus, the first member 120 can suppress further permeation of moisture, which has permeated into the through-hole TH, into the adhesive layer 80, the optical layer 70, the touch layer 60, the encapsulation layer 50, the display panel 40 and/or the support member 20 disposed along the through-hole TH.

The first member 120 can be made of a non-conductive material or a conductive material. The first member 120 can be a light blocking member, a light blocking film or a shield layer, but is not limited to the terms and material. The first member 120 can block the introduction of light from the display panel 40 into the through-hole TH, and can change or block the flow of charges generated from the front member 90. The first member 120 can cover a part of at least one of a side surface of the support member 20, a side surface of the display panel 40 including a side surface of the substrate 30 and a side surface of the inner bezel area 43, a side surface of the encapsulation layer 50, a side surface of the touch layer 60, a side surface of the optical layer 70 and a side surface of the adhesive layer 80 exposed through the first hole TH1.

The display apparatus 100 according to an exemplary embodiment of the present disclosure can include a second member 135 for connecting a lower side of the first member 120 to the conductive member 10. The second member 135 can be a conductive pattern having electrical conductivity and can be made of the same material as the first member 120, but is not limited thereto.

The second member 135 can electrically connect the first member 120 to the conductive member 10. For example, the second member 135 can connect a lower surface of the first member 120 and a side surface of the conductive member 10. The second member 135 can be disposed on an area of the support member 20 exposed through the second hole TH2, which is the through-hole TH of the conductive member 10. The second member 135 can have a ring shape or an annular shape, but is not limited thereto.

The second member 135 moves the charges accumulated in the front member 90 to the conductive member 10 through the first member 120 like the third member 115 to be described later. Thus, it is possible to suppress the accumulation of charges in the side surface of the edge of the display panel 40, particularly in the inner bezel area 43. Accordingly, it is possible to suppress malfunction caused by an electric field generated on the side surface of the edge of the display panel 40 and thus possible to improve the reliability of the display apparatus 100.

The first member 120, the second members 130 and 135 and/or the third member 115 can be formed by pneumatic spray application or electrostatic spray application. For example, the pneumatic spray application can involve forcing an ink material inside a syringe into a nozzle and spraying the ink material with air pressure. The electrostatic spray application can involve assigning charges to an ink material by applying a voltage thereto and then spraying the charged ink material through a spray nozzle. A spray nozzle can spray an ink material while rotating inside the fixed through-hole TH of the display apparatus 100, or an ink material can be sprayed while the through-hole TH of the display apparatus 100 rotates around a fixed spray nozzle NZ. However, the present disclosure is not limited thereto.

According to an exemplary embodiment of the present disclosure, it is possible to reduce noise caused by a light leakage in a sensor area where an optical sensor component is disposed. Further, it is possible to suppress damage to components caused by static electricity by discharging charges of a cover window to a conductive member. Therefore, it is possible to improve the reliability of the display apparatus.

According to an exemplary embodiment of the present disclosure, it is possible to reduce manufacturing cost and time by simplifying a process of forming or attaching a light blocking member or a conductive member.

A display apparatus according to an exemplary embodiment of the present disclosure can be described as follows.

A display apparatus according to an exemplary embodiment of the present disclosure can include a display panel that includes a first area including a sensor area where a first hole is disposed, and a second area disposed along an outer periphery of the first area. The display apparatus, au also include a front member on an upper surface of the display panel, and a support member on a rear surface of the display panel. The display apparatus can further include a conductive member on a rear surface of the support member. The display apparatus can also include a first member covering a border of a rear surface of the front member exposed through the first hole and an inner surface of the first hole.

According to some exemplary embodiments of the present disclosure, the display apparatus can further include a second member connecting a lower side of the first member and the conductive member.

According to some exemplary embodiments of the present disclosure, the second member can have an annular sector shape.

According to some exemplary embodiments of the present disclosure, the second member can have an annular shape.

According to some exemplary embodiments of the present disclosure, the display apparatus can further include a third member connecting the conductive member and the front member in at least a part of the second area.

According to some exemplary embodiments of the present disclosure, at least one of the first member, the second member and the third member can have conductive properties.

According to some exemplary embodiments of the present disclosure, the display panel can include a substrate including a first layer, an interlayer insulating film and a second layer, and an emission unit on an upper surface of the substrate. The emission unit can include a driving element layer configured by a plurality of transistors and a light emitting diode layer on the driving element layer.

According to some exemplary embodiments of the present disclosure, a hole in the light emitting diode layer can have a greater diameter than the first hole.

According to some exemplary embodiments of the present disclosure, the emission unit can further include a first bezel aera extending from an inner surface of the hole in the light emitting diode layer to the inner surface of the first hole, and a second bezel area disposed along an outer periphery of the light emitting diode layer.

According to some exemplary embodiments of the present disclosure, the first bezel area and the second bezel area can have non-conductive property.

According to some exemplary embodiments of the present disclosure, the display apparatus can further include an encapsulation layer on the display panel, a touch layer on the encapsulation layer, an optical layer on the touch layer, and an adhesive layer on the optical layer.

According to some exemplary embodiments of the present disclosure, the display apparatus can further include a first light blocking member disposed between the adhesive layer and the front member and disposed along the periphery of the first hole in the first area, and a second light blocking member disposed along an outer periphery in the second area.

A display apparatus according to another exemplary embodiment of the present disclosure can include a display panel that includes a first area where a hole is disposed and a second area disposed along an outer periphery of the first area. The display apparatus can also include a front member disposed on an upper surface of the display panel and including a first light blocking layer disposed along the periphery of the hole in the first area and a second light blocking layer disposed along the second area. The display apparatus can further include a support layer disposed on a rear surface of the display panel and sharing the hole. The display apparatus can also include a conductive layer disposed on a rear surface of the support layer and sharing the hole, and a first member covering an inner surface of the hole.

According to some exemplary embodiments of the present disclosure, the display apparatus can further include a second member connecting a side of the first member and the conductive layer.

According to some exemplary embodiments of the present disclosure, the second member can have a ring shape or an annular sector shape.

According to some exemplary embodiments of the present disclosure, one side of the first member can be connected to the first light blocking layer, and the other side of the first member can be connected to the conductive layer through the second member.

According to some exemplary embodiments of the present disclosure, the display apparatus can further include a third member disposed in at least a part of the second area and connecting the conductive layer and the front member.

According to some exemplary embodiments of the present disclosure, one side of the first member can be connected to the first light blocking layer and the other side of the first member can be connected to the conductive layer through the second member.

According to some exemplary embodiments of the present disclosure, at least one of the first member, the second member and the third member can be made of a conductive ink.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:

a display panel including an active area, a sensor area disposed inside the active area and having a first hole, and a non-active area disposed along an outer periphery of the active area;

a front member on an upper surface of the display panel;

a support member on a rear surface of the display panel;

a conductive member on a rear surface of the support member; and a first member covering a border of a rear surface of the front member exposed from the first hole, and covering an inner surface of the first hole.

2. The display apparatus according to claim 1, further comprising:

a second member connecting a lower side of the first member and the conductive member.

3. The display apparatus according to claim 2, wherein the second member has an annular sector shape.

4. The display apparatus according to claim 2, wherein the second member has an annular shape.

5. The display apparatus according to claim 1, further comprising:

a third member connecting the conductive member and the front member in at least a part of the non-active area.

6. The display apparatus according to claim 2, wherein at least one of the first member and the second member has a conductive property.

7. The display apparatus according to claim 1, wherein the display panel includes:

a substrate including a first layer, an interlayer insulating film and a second layer; and an emission unit on an upper surface of the substrate, and the emission unit includes:

a driving element layer configured by a plurality of transistors; and a light emitting diode layer on the driving element layer.

8. The display apparatus according to claim 7, wherein a hole in the light emitting diode layer has a greater diameter than the first hole.

9. The display apparatus according to claim 8, wherein the emission unit further includes:

a first bezel area extending from an inner surface of the hole in the light emitting diode layer to the inner surface of the first hole; and a second bezel area disposed along an outer periphery of the light emitting diode layer.

10. The display apparatus according to claim 9, wherein the first bezel area and the second bezel area have a non-conductive property.

11. The display apparatus according to claim 1, further comprising:

an encapsulation layer on the display panel;

a touch layer on the encapsulation layer;

an optical layer on the touch layer; and an adhesive layer on the optical layer.

12. The display apparatus according to claim 11, further comprising:

a first light blocking member disposed between the adhesive layer and the front member, and disposed along a periphery of the first hole in the active area; and a second light blocking member disposed along an outer periphery in the non-active area.

13. A display apparatus, comprising:

a display panel including an active area, a sensor area disposed inside the active area and having a hole, and a non-active area disposed along an outer periphery of the active area;

a front member on an upper surface of the display panel, and including a first light blocking layer disposed along a periphery of the hole in the active area, and a second light blocking layer disposed along the non-active area;

a support layer on a rear surface of the display panel and sharing the hole;

a conductive layer on a rear surface of the support layer and sharing the hole; and a first member covering an inner surface of the hole.

14. The display apparatus according to claim 13, further comprising:

a second member connecting one side of the first member and the conductive layer.

15. The display apparatus according to claim 14, wherein the second member has a ring shape or a partial ring shape.

16. The display apparatus according to claim 14, wherein the one side of the first member is connected to the first light blocking layer, and another side of the first member is connected to the conductive layer through the second member.

17. The display apparatus according to claim 14, further comprising:

a third member disposed in at least a part of the non-active area, and connecting the conductive layer and the front member.

18. The display apparatus according to claim 17, wherein the one side of the first member is connected to the first light blocking layer, and another side of the first member is connected to the conductive layer through the second member.

19. The display apparatus according to claim 17, wherein at least one of the first member and the third member is made of a conductive ink.

20. The display apparatus according to claim 14, wherein at least one of the first member and the second member is made of a conductive ink.

* * * * *